(12) United States Patent
Hill

(10) Patent No.: US 7,180,335 B2
(45) Date of Patent: Feb. 20, 2007

(54) PEAK DETECTOR

(75) Inventor: Barrington James Hill, Ledbury (GB)

(73) Assignee: Facility Monitoring Systems Limited (GB)

( * ) Notice: Subject to any disclaimer, the term of this patent is extended or adjusted under 35 U.S.C. 154(b) by 33 days.

(21) Appl. No.: 11/185,369

(22) Filed: Jul. 20, 2005

(65) Prior Publication Data

US 2006/0022719 A1 Feb. 2, 2006

(30) Foreign Application Priority Data

Jul. 27, 2004 (GB) ................. 0416666.6

(51) Int. Cl.
*H03K 5/153* (2006.01)
(52) U.S. Cl. ............... 327/58; 327/59; 327/60
(58) Field of Classification Search ............ None
See application file for complete search history.

(56) References Cited

U.S. PATENT DOCUMENTS

| 4,575,683 A | * | 3/1986 | Roberts et al. ............. 329/311 |
| 5,428,307 A |   | 6/1995 | Dendinger .................. 327/62 |
| 5,546,027 A | * | 8/1996 | Shinozaki et al. ........... 327/59 |
| 6,041,084 A | * | 3/2000 | Nagaraj ..................... 375/317 |
| 6,211,716 B1 | * | 4/2001 | Nguyen et al. ............. 327/307 |

FOREIGN PATENT DOCUMENTS

JP 9189725 1/1996

OTHER PUBLICATIONS

Search Report Sep. 16, 2004.

* cited by examiner

*Primary Examiner*—Tuan T. Lam
*Assistant Examiner*—Hiep Nguyen
(74) *Attorney, Agent, or Firm*—Ira S. Dorman

(57) ABSTRACT

A diode-less peak detector comprises first and second comparators (U1, U2) for comparing an input signal (V) with a peak signal. The first comparator (U1) is connected such that the peak signal functions as a reference and the second comparator (U2) is connected such that the input signal functions as a reference. An inverter (U4) is provided for inverting the output of one of the first and second comparators. Means, such as an AND gate (U3) is provided responsive to the output of the inverter and the other of the first and second comparators so as to provide a switching signal. A MOSFET (Q1) is provided responsive to the switching signal and adapted to adjust the magnitude of the peak signal towards the magnitude of the input signal only when the magnitude of the input signal is greater than the magnitude of the peak signal.

8 Claims, 2 Drawing Sheets

PEAK DETECTOR

This invention relates to a peak detector for the detection of positive (or maximum) or negative (or minimum) peaks in an input signal.

DESCRIPTION OF PRIOR ART

Peak detector circuits measure the maximum or minimum value of an input signal over a sample period. Conventionally a peak detector incorporates a diode and a capacitor, usually in combination with operational amplifiers to buffer the signal. Such peak detectors tend to have problems with long-term drift and also need to compensate for the forward voltage drop across any diodes forming part of the circuit.

OBJECT OF THE INVENTION

It is therefore an object of the present invention to provide a peak detector which overcomes, or at least ameliorates, the disadvantages of known peak detectors.

SUMMARY OF THE INVENTION

According to the present invention there is provided a peak detector comprising:

first and second comparators for comparing an input signal with a peak signal, the first comparator being connected such that the peak signal functions as a reference and the second comparator being connected such that the input signal functions as a reference;

an inverter for inverting the output of one of the first and second comparators;

means responsive to the output of the inverter and the other of the first and second comparators so as to provide a switching signal; and a MOSFET responsive to the switching signal and adapted to adjust the magnitude of the peak signal towards the magnitude of the input signal only when the magnitude of the input signal is greater than the magnitude of the peak signal.

The detector may be adapted to function as a maximum peak detector with the inverter connected to the output of the second comparator. Alternatively, the detector may be adapted to function as a minimum peak detector with the inverter connected to the output of the first comparator.

The means for providing the switching signal may comprise an AND gate.

Alternatively, the means for providing the switching signal may comprise a sequence of two NAND gates. One of the NAND gates may be adapted to receive a signal for resetting the peak signal.

A capacitor may be provided for storing the peak signal. A MOSFET may be connected across the capacitor for resetting the peak signal.

For a better understanding of the present invention and to show more clearly how it may be carried into effect reference will now be made, by way of example, to the accompanying drawings in which:

DESCRIPTION OF PREFERRED EMBODIMENTS

Figure 1:
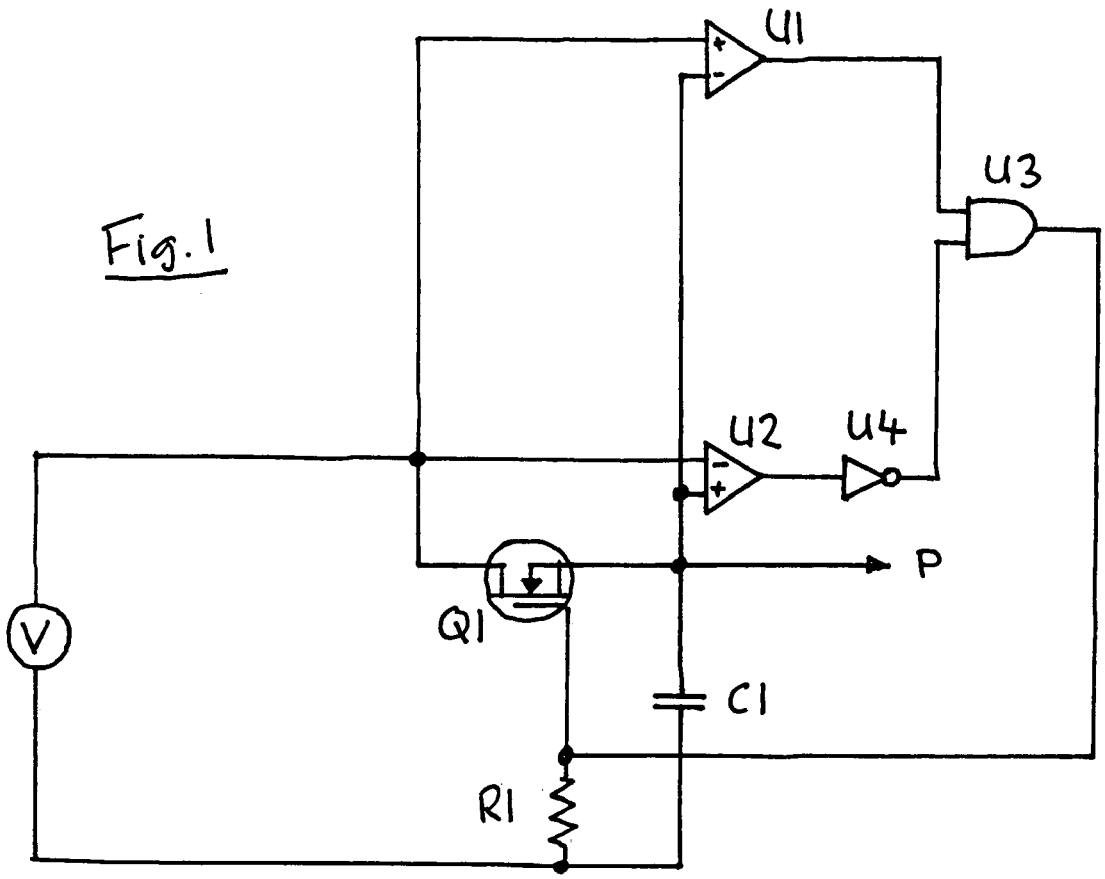
FIG. 1 is a diagrammatic illustration of one embodiment of a peak detector according to the present invention, in the form of a positive or maximum peak detector.

In the positive or maximum peak detector circuit shown in FIG. 1 an input signal V is applied to the non-inverting input of a first comparator U1 and to the inverting input of a second comparator U2. The comparators may be LM339 or similar components. The input signal V is also connected to the source of an N-channel MOSFET Q1. It will be appreciated that a P-channel MOSFET can be used with appropriate inversion of signals.

The drain of the MOSFET Q1 is connected to the inverting input of the first comparator U1 and to the non-inverting input of the second comparator U2. The drain of the MOSFET Q1 is also connected to a capacitor C1 which effectively stores the magnitude of the peak voltage.

When a positive voltage is applied to the gate of the MOSFET Q1, the MOSFET has a low resistance, but when the voltage at the gate is pulled low, the MOSFET has a very high resistance.

When the voltage of the input signal V is greater than the voltage on capacitor C1, the output of the first comparator U1 is high and the output of the second comparator U2 is low. The output of the second comparator U2 is connected to an inverter U4 and consequently when the voltage of the input signal V is greater than the voltage on the capacitor C1, the output of the inverter U4 is high.

The output of the first comparator U1 and the output of the inverter U4 are connected to the inputs of an AND gate U3 which effectively provides a switching signal for the MOSFET. Thus, when both the output of the first comparator U1 and the output of the inverter U4 are high the output of the AND gate U3 is high.

The output of the AND gate U3 is connected to the gate of the MOSFET Q1 and so switches on the MOSFET while the voltage on the capacitor C1 is less than the voltage of the input signal V. The MOSFET Q1 in turn charges the capacitor C1 until the applied voltage matches the voltage of the input signal V.

When the voltage on capacitor C1 matches the voltage of the input signal V, the outputs of the first comparator U1 and the second comparator U2 both either go high or low. In either case, the inputs to the AND gate U3 are not both high so the output of the AND gate U3 goes low and switches off the MOSFET Q1. The peak voltage is output at P.

When the voltage on the capacitor C1 is greater than the voltage of the input signal V, both inputs to the AND gate U3 are low and the MOSFET Q1 is switched off.

Consequently, the MOSFET Q1 is only switched on when the magnitude of the voltage of the input signal is greater than the magnitude of the voltage on the capacitor C1.

The peak detector circuit shown in FIG. 1 is effective due to the way in which the circuit operates when the voltage on the capacitor C1 is the same as the voltage of the input signal V. It is significant that the MOSFET Q1 is switched off when the voltage on the capacitor C1 is the same as the voltage of the input signal V. If this is not accomplished then the voltage on the capacitor C1 would follow the voltage of the input signal V.

Figure 2:
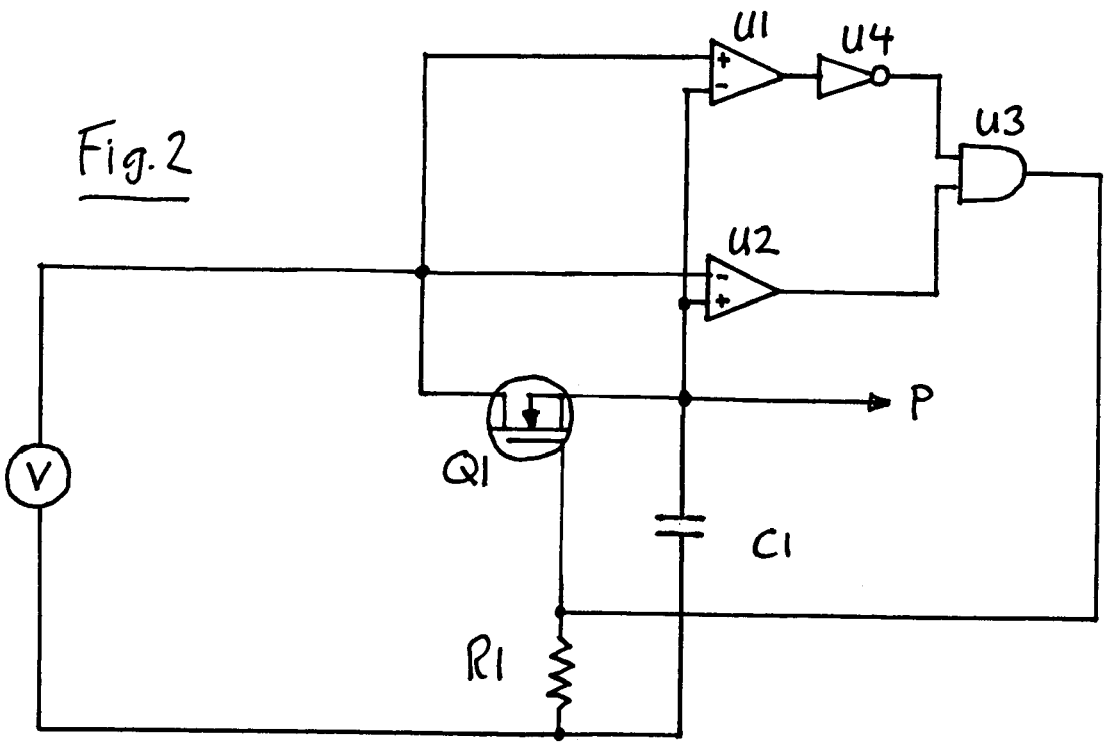
FIG. 2 is a diagrammatic illustration of another embodiment of a peak detector according to the present invention, in the form of a negative or minimum peak detector.

The negative or minimum peak detector circuit shown in FIG. 2 uses the same components as the circuit shown in FIG. 1 and the same references are employed. However, in the peak detector of FIG. 2 the inverter U4 is connected to the output of the first comparator U1 instead of the output of the second comparator U2.

The input signal V is still connected to the non-inverting input of a first comparator U1 and to the inverting input of a second comparator U2 and is also connected to the source of the MOSFET Q1.

The drain of the MOSFET Q1 is still connected to the inverting input of the first comparator U1 and to the non-inverting input of the second comparator U2. The drain of the MOSFET Q1 is also connected to the capacitor C1.

When the voltage of the input signal V is lower than the voltage on capacitor C1, the output of the first comparator U1 is low and the output of the second comparator U2 is high. The output of the first comparator U1 is connected to the inverter U4 and consequently when the voltage of the input signal V is lower than the voltage on the capacitor C1, the output of the inverter U4 is high.

The output of the inverter U4 and the output of the second comparator U2 are connected to the inputs of the AND gate U3. Thus, when both the output of the inverter U4 and the output of the second comparator U2 are high the output of the AND gate U3 is high.

The output of the AND gate U3 is connected to the gate of the MOSFET Q1 and so switches on the MOSFET while the voltage on the capacitor C1 is higher than the voltage of the input signal V. The MOSFET Q1 in turn charges the capacitor C1 until the applied voltage matches the voltage of the input signal V.

When the voltage on capacitor C1 matches the voltage of the input signal V, the outputs of the first comparator U1 and the second comparator U2 both either go high or low. In either case, the inputs to the AND gate U3 are not both high so the output of the AND gate U3 goes low and switches off the MOSFET Q1. The peak voltage is output at P.

When the voltage on the capacitor C1 is lower than the voltage of the input signal V, both inputs to the AND gate U3 are low and the MOSFET Q1 is switched off.

Consequently, the MOSFET Q1 is only switched on when the magnitude of the voltage of the input signal is greater than the magnitude of the voltage on the capacitor C1.

It will be appreciated that minor modifications may be made or required to the circuits described with reference to FIGS. 1 and 2. For example, the AND gate U3 may be replaced by a pair of NAND gates. Buffering may be required, for example in the form of operational amplifiers, for the input signal and to be able to use the peak voltage stored on the capacitor C1.

Further, the voltage across the capacitor C1 is typically reset to a suitable value, such as zero volts, from time to time. This can be effected, for example, by means of a MOSFET across the capacitor C1 or by providing additional logic components adapted to force MOSFET Q1 to switch on.

Figure 3:
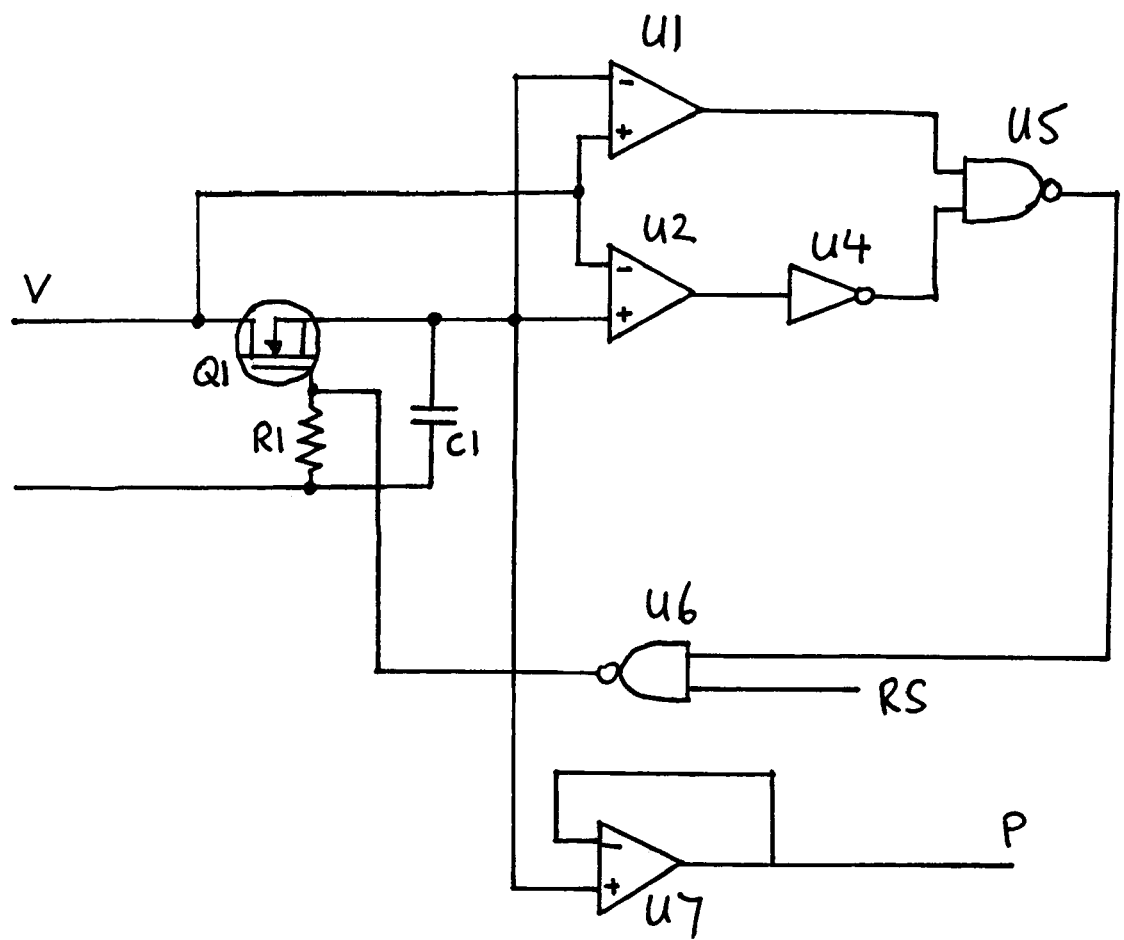
FIG. 3 is a diagrammatic illustration of a further embodiment of a peak detector according to the present invention similar to that illustrated in FIG. 1.

The positive or maximum peak detector shown in FIG. 3 is similar to that shown in FIG. 1 and the same references are used to denote the same components.

The peak detector shown in FIG. 3 differs from that shown in FIG. 1 in that the AND gate U3 is replaced by a sequential pair of first and second NAND gates U5 and U6, with the second NAND gate U6 having an input for a reset signal RS. Furthermore, the peak voltage P is output from the circuit by way of a third comparator U7.

The peak detector described above and shown in the figures can be used, for example, in numerous applications in which it is required to know the peak voltage over a predetermined time period, for example in automatic gain control (AGC) or where it is required to determine the maximum height of discrete voltage pulses, as in particle counting. The negative or minimum peak can particularly be used as part of a baseline restoration circuit, typically used to remove varying DC bias. The peak detector circuit is of particular use in low supply voltage application. The use of a MOSFET in place of a diode results in faster operation because the resistance of a MOSFET, when switched on, is significantly lower than that of a diode.

I claim:

1. A peak detector comprising:
   first and second comparators for comparing an input signal with a peak signal, the first comparator being connected such that the peak signal functions as a reference and the second comparator being connected such that the input signal functions as a reference;
   an inverter for inverting the output of one of the first and second comparators;
   means responsive to the output of the inverter and the other of the first and second comparators so as to provide a switching signal; and
   a MOSFET responsive to the switching signal and adapted to adjust the magnitude of the peak signal towards the magnitude of the input signal only when the magnitude of the input signal is greater than the magnitude of the peak signal.

2. The peak detector of claim 1, wherein the detector is adapted to function as a maximum peak detector and the inverter is connected to the output of the second comparator.

3. The peak detector of claim 1, wherein the detector is adapted to function as a minimum peak detector and the inverter is connected to the output of the first comparator.

4. The peak detector of claim 1, wherein the means for providing the switching signal comprises an AND gate.

5. The peak detector of claim 1, wherein the means for providing the switching signal comprises a sequence of two NAND gates.

6. The peak detector of claim 5, wherein one of the NAND gates is adapted to receive a signal for resetting the peak signal.

7. The peak detector of claim 1, wherein a capacitor is provided for storing the peak signal.

8. The peak detector of claim 7 including a MOSFET connected across the capacitor for resetting the peak signal.

* * * * *